United States Patent
Gasparik

(12) 
(10) Patent No.: US 6,483,354 B1
(45) Date of Patent: Nov. 19, 2002

(54) PCI-X DRIVER CONTROL

(75) Inventor: Frank Gasparik, Monument, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/938,929

(22) Filed: Aug. 24, 2001

(51) Int. Cl.$^7$ .............................................. H03K 3/00
(52) U.S. Cl. ...................... 327/112; 327/317; 327/378; 327/403; 326/27; 326/83
(58) Field of Search .................. 327/108–112, 182, 327/261, 285, 262, 288, 291, 341, 297, 299, 403, 404, 378, 392–396, 399–401, 317, 362; 367/412; 326/26–28, 29–34, 82, 83, 86–91; 365/189.05, 194, 233

(56) References Cited

U.S. PATENT DOCUMENTS

| | | | |
|---|---|---|---|
| 5,218,239 A | * | 6/1993 | Boomer ........................ 326/27 |
| 5,220,208 A | * | 6/1993 | Schenck ....................... 326/27 |
| 5,568,081 A | * | 10/1996 | Lui et al. ....................... 326/27 |
| 6,323,756 B1 | * | 11/2001 | Yoshikawa et al. .... 340/310.01 |

* cited by examiner

Primary Examiner—Timothy P. Callahan
Assistant Examiner—Minh Nguyen
(74) Attorney, Agent, or Firm—Suiter & Associates PC

(57) ABSTRACT

Process voltage temperature compensation are used for a bus driver; specifically, a PCI-X 2.0 DDR Standard bus driver. Performance is improved by enhancing the speed of the PCI-X buffer by removing the statically controlled gate stages and providing for output signal slew control by dual use of on-resistance of signal pass transistors. Although directed to PCI-X technology, this circuitry may also be used in SCCI, controlled impedance drivers, and other buffers, where short propagation delay and signal integrity are of concern.

45 Claims, 3 Drawing Sheets

PRIOR ART

US 6,483,354 B1

PCI-X DRIVER CONTROL

FIELD OF THE INVENTION

The present invention relates to bus driver circuitry and more particularly to driving high speed data lines with compensation for process voltage temperature effects.

BACKGROUND OF THE INVENTION

A PCI bus system typically interconnects a large number of electronic devices. The system must maintain, manage and communicate bi-directional data from one device to another device or several devices at once. Each device may output different voltage levels while maintaining capability to read data on the bus. One reason for the difficulty of continuously increasing bus speeds to match the continuously increasing processor speeds is that input/output buffers coupled to the busses must often operate across a wide variety of operating conditions. For instance, the performance of an input/output buffer changes with respect to conditions such as process, voltage and temperature.

A parallel data bus typically comprises a number of bus lines to which the components of a computer system may be connected for communicating information between one another. Each component coupled to the data bus typically includes a set of bus driver circuits for transmitting data via the bus lines by switching the voltages of the bus lines between voltages that correspond to logic states, however defined. The speed at which a bus driver circuit switches the voltages of the bus line between logic states is called the "slew rate," and the slew rate of the bus driver circuit is an extremely important characteristic for ensuring proper operation of the bus driver circuit at the clock speed of the data bus.

FIG. 1 shows a simplified sketch of a prior art PCI-X driver utilizing the feature of controlled output impedance. The input signal is routed by a number of gates to appropriate driver's output devices. The device selection is determined by impedance controller to correct for Process/Voltage/Temperature (PVT) effects. The size of these devices ($MP_{1x}$, $MP_{2x}$, ... $MP_{1x}$) are weighted in a certain manner (binary or with other ratios) to achieve a desired output impedance in conjunction with discrete resistor $R_p$ or $R_N$. Control signals for selection of a specific device are labeled CTRL and are generated by impedance controller as static logic signal and are set periodically to make the PVT adjustments to the output impedance.

P-channel and N-channel output devices are selected by separate paths to allow enabling the particular device, dual power supply mode of operation and also for the power-down feature.

To select the output device $MP_{1x}$, the control signal $CTRL_{1P}$ is set low and $CTRL_{2P}$ is set high. This selection with channel the input signal IN through inverters $I_1$, $I_2$, NOR gate $N_1$ and AND gate $A_1$ to the gate of device $MP_{1x}$. The $MP_{1x}$ device provides drive for positive-going or rising output signal.

Similarly, for the falling edge of the output signal, $MN_{1x}$ is selected by setting $CTRL_{1N}$ high, $CTRL_{2N}$, low and $CTRL_{3N}$ also low. In the case, the input signal IN is channeled to the gate of N-channel MOSFET $MN_{1x}$ output device through inverters $I_1$, $I_2$, NAND gate $N_2$, and NOR gates $N_2$ and $N_3$.

The greatest shortcoming of this approach is the excessive propagation delay from input IN to the output OUT due to the number of stages that the input signal has to propagate. In this case, there are five stages of delays, although in other implementations there may be a greater number of stages for more sophisticated PVT controllers. Since logical components of the same kind have variances in their individual propagation times from input to output, the greater the number of stages, the greater the potential cumulative variances of the propagation time of the various output drivers of the bus.

Another problem is adequately controlling the rise and fall times in complex output buffers. Large output devices are required for the delivery of adequate signal to drive transmission lines such as back-plane printed circuit board traces. As a result, the output impedances of the buffers become much lower than the characteristic impedances of the drive transmission lines. Consequently, mismatches lead to signal reflections and ringing and negatively affect the signal integrity. Recent drivers offer controlled output impedances to minimize the impedance mismatches.

Yet another problem results from the circuit implementation of FIG. 1 is a lack of output signal slew rate control. The output signal transition may be too fast or too slow depending upon device sizes, the circuit parasitics, PVT conditions, and buffer load.

One disadvantage of operating a system at a high speed is that the system may not provide a desired slew rate at high operating speeds. In particular, the constraints on loading, bus length, and bus pitch in conjunction with block data transfer do not provide for a stable slew rate at several hundred MHz or higher.

Another disadvantage of operating the system at high speed is that the system incurs ringing in the power lines VDD and GND, resulting in signal distortion. Thus, the inductive/capacitive characteristics of the bus and signal lines are exaggerated at a higher frequency resulting in signal distortion.

Yet another disadvantage of operating the system at high speed is that the system cannot provide low error rates. In particular, at high operating frequencies, the clocking scheme of the system does not guarantee synchronization between transmitted data and the clocking scheme in the destination device. Thus, incorrect data can be captured in a destination device.

The prior art approaches exhibit unacceptable signal delays and uncontrolled output signal rise and fall times.

The prior art drive circuits do not meet the newer high speed driver requirements for interface communications.

In the prior art, the slew rate was asymmetric.

SUMMARY OF THE INVENTION

This invention presents a method and device for driving high speed data lines by reducing the number of logic stages, separating the control logic from the data logic, and controlling a variable impedance circuit according to process, voltage, temperature (PVT) variations.

This invention relates to a circuit comprising a driver circuit configured to output a signal; a first capacitance formed from a portion of the driver circuit from a combination of discrete and parasitic capacitances; and a variable impedance circuit forming a portion of the driver circuit and coupled to the first capacitance, the variable impedance circuit configured to adjust the slew rate in response to changes in fabrication process and operating conditions wherein the variable impedance circuit comprises a first resistor, a first NMOS transistor and a first PMOS transistor in parallel and coupled to the first capacitance, wherein the gate of the first PMOS transistor is coupled to a process, voltage, and temperature controller.

This invention relates to a variable impedance circuit for use in a bus driver circuit, comprising a first impedance, a first NMOS transistor and a first PMOS transistor in parallel, a second impedance, a second NMOS transistor and a second PMOS transistor in parallel, wherein the a first combination of the first impedance, the first NMOS transistor, and the first PMOS transistor have a first end and an opposing second end and the second combination of the second impedance, the second NMOS transistor, and the second PMOS transistor has a third end and a fourth end, wherein the second end of the first combination and the third end of the second combination are directly electrically connected, wherein the first end of the first combination receives an input signal.

This invention relates to a bus driver circuit, comprising a first CMOS inverter which includes a first PMOS transistor and a first NMOS transistor, the transistors being electrically connected to one another; a first set of logic gates for controlling the first PMOS transistor by a first control signal; a second set of logic gates for passing an first input signal; and a third set of logic gates for controlling the first NMOS transistor by a second control signal; wherein the first set of logic gates, the second set of logic gates, and the third set of logic gates have no logic gates in common.

This invention relates to a method of outputting a signal on a bus driver circuit, comprising inputting an initial input signal; providing process, voltage, temperature controller signals to a variable impedance circuit through which at least a portion of the initial input signal passes; and outputting an output signal corresponding to the initial input signal.

This invention relates to a method of outputting a signal on a bus driver circuit, comprising providing separate logic paths for the control signals and the data signal.

This invention improves the bus driver circuit's propagation delay and controls the output signal rise and fall times by using a lower number of logic stages.

This invention provides better performance over current devices.

This invention offers cost effectiveness as the circuitry requires a reduced silicon area.

DETAILED DESCRIPTION OF THE INVENTION

The continuous increase in performance of personal computers, telecommunications, etc., demands faster and faster circuitry. One such example is the PCI-X 2.0 DDR technology (second generation of the Peripheral Component Interface, Double Data Rate). It serves as an interface between the PC and peripheral components such as VGA controllers, etc. Presently, circuit implementations are very complex due to the large number of functions they perform in conjunction with other logic operations. The overall driver's propagation delay becomes a limiting factor of performance.

Technology advances in integrated circuit fabrication have led to more compact chip designs. Lower voltage processes come with the smaller size. CMOS devices can use low voltage power supplies to prevent damage to devices having small feature sizes, and to reduce the overall power consumption. For example, power supplies for CMOS devices are being reduced from 3.3 volts to 2.5 volts and lower. However, low voltage CMOS devices often interface with transistor—transistor logic (TTL) devices that operate at higher supply voltages, e.g., 5 volts.

The Peripheral Component Interconnect bus standard requires a minimum of 2.4 volts on the bus to identify a high transition. Typically, there are a large number of buffers and drivers tied to the bus, any of which can be a TTL device. Therefore, each device must be capable of driving at least 2.4 volts, and be able to withstand voltage levels as high as 6.5 volts.

Another issue with multiple supply voltages is that the different voltages have different characteristics. Some voltages may be stable before others. In a worst case scenario, the highest voltage, e.g., 5 volts, may stabilize first, and already be at its highest level while the other voltages, e.g., 3.3 volts and 1.8 volts, are still at ground or low level. Such an initial condition at power-up could expose low voltage CMOS devices to the full 5 volts. This can cause damage to the device or a shortened life. For example, this could damage the gate oxide in the transistors that form the devices. This situation can be exacerbated by the PCI specification, which requires some of the PIN's to power up at 5 volts.

The present invention provides a method and an apparatus for adjusting both the slew rate and the impedance of buffer circuits in order to compensate for variations in conditions such as process, voltage and temperature in drivers. Such a method and apparatus is readily implemented in drivers with minimal area to maximize the performance of buffer circuits over a variety operating conditions. To minimize problems with ringing and propagation delays, shorter length conductors are used.

Figure 1:
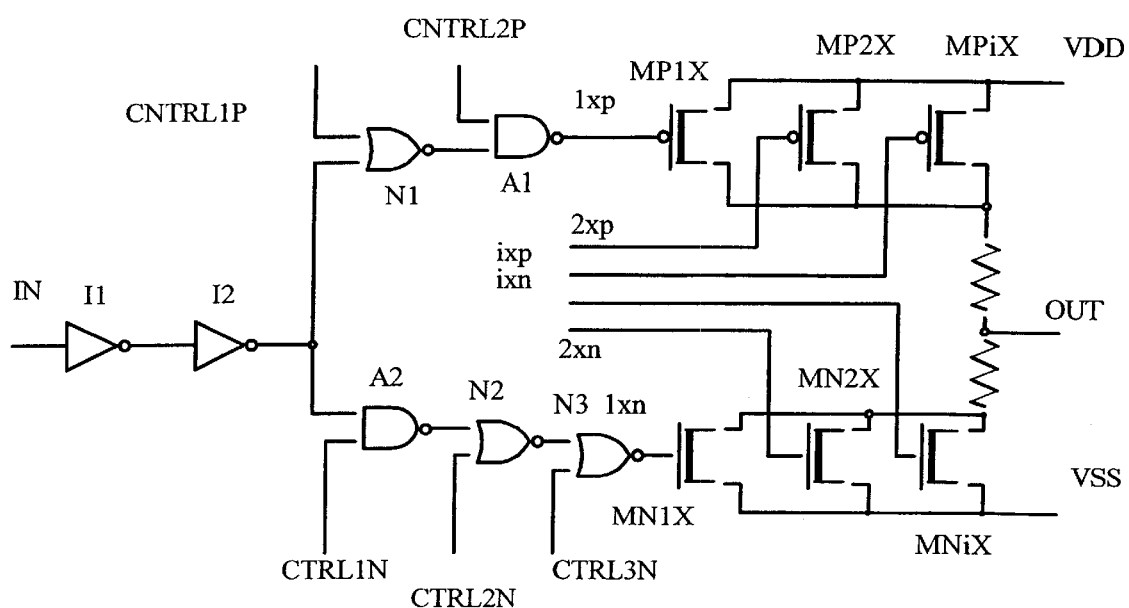
FIG. 1 is a schematic diagram illustrating a prior art bus driver.
Figure 2:
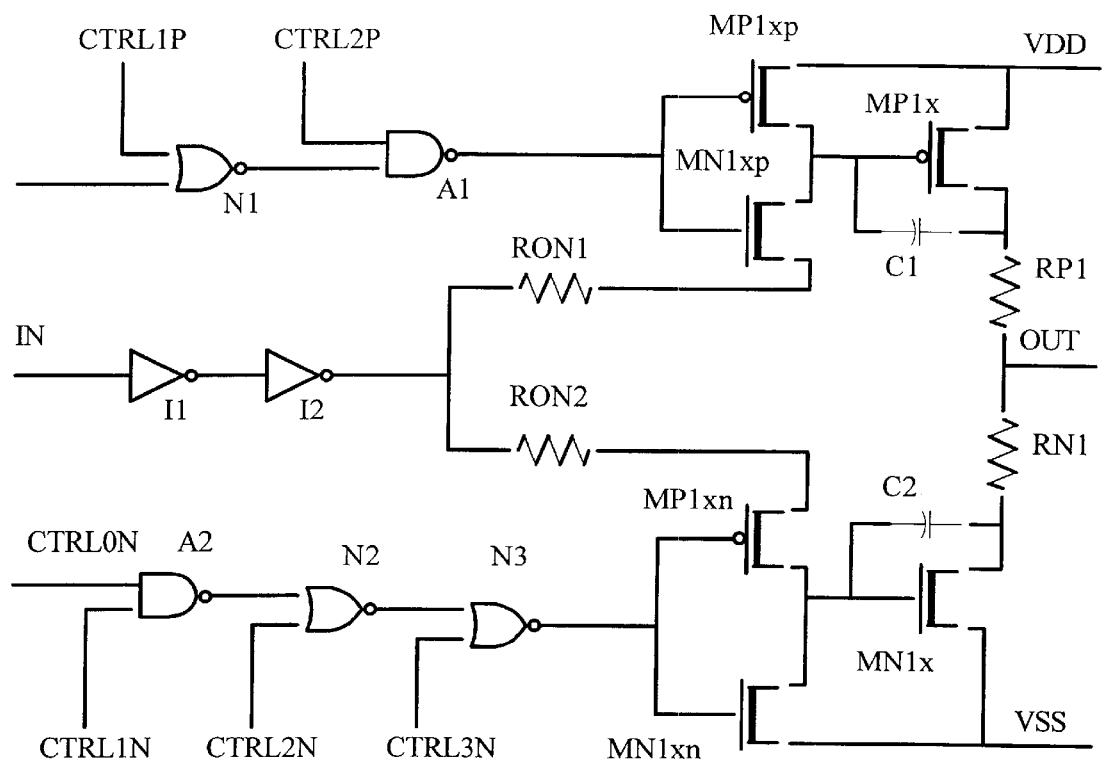
FIG. 2 is a schematic diagram illustrating a first embodiment of the present invention.

FIG. 2 depicts the key features of this invention. The first key feature is the selection of the desired devices by a logic function outside of the signal path. That is, the signal path and the digital control logic are arranged as separate circuits which interface with the output drivers. The device selection signals called CTRL are all static signals, determined by the PVT impedance controller during the period of absent data transfers. To achieve this task, only the resulting decoded enable signal is routed to the specific device.

For simplicity, only the 1x devices are shown. It is understood that the actual circuitry would include all the 2x to ix devices. For selection of the output device driver $MP_{1x}$, the PVT controller sets the appropriate static control signal levels ($CTRL_{0P}$, $CTRL_{1P}$, $CTRL_{2P}$) in such a way that node voltage $V_{G1x}$ is high. This will turn off the P-channel $MP_{1xP}$, and turn on the N-channel $MN_{1xP}$. The N-channel $MN_{1xP}$ serves as a pass gate for the input signal IN which is fed through serial resistor $R_{ONI}$. The P-channel $MP_{1xP}$ is used to tri-state the output device $MP_{1x}$ by shorting its gate to VDD.

Two predriver inverters $I_1$ and $I_2$ are sized for the minimum delay of the entire PCI-X driver. The output device is very large to supply large output current of a few hundred mA. Removal of three or more control gates from the input signal path results in a substantially faster buffer. In the present invention, the input signal propagates only through one serial device $MN_{1xp}$.

In many high speed circuits, there is a requirement to control the slew rates of signals, the rate at which the signal changes in volts/second, for various reasons including the minimization of electromagnetic interference. For signals of a given magnitude, slew rate values can be converted to rise and fall transition times. The need to control slew rates is particularly true in high speed interface circuits.

The second key feature of the invention is the dual utilization of the serial device $MN_{1xP}$ for slew rate control of the output signal. The on-resistance of the pass device $MN_{1xP}$ with an optional discrete resistor $R_{ON1}$ constitutes an RC circuit in conjunction with the capacitor $C_1$. Output driver P-channel $MP_{1x}$ gate to drain overlap capacitance in conjunction with any additional parallel discrete capacitance will form the capacitance $C_1$. During the output transition, the equivalent capacitance is $C_{M=}(1-A_M*C_1)$, where $A_{M=} - g_m(MP_{1x})*\{[r_{DS}(MP_{1x})+R_{p1}]\|[r_{DS}(MN_{1x})+R_{N1}]\}$. This gain $A_M$ is known as Miller gain and the $C_M$ as Miller capacitance. It is desirable to have the Miller gain $A_M$ as low as possible for wide bandwidth linear amplifiers. In the case of digital output drivers, the high gain is desirable to have a large output current in a single stage. The variable $g_m(MP_{1x})$ represents the value of the transconductance of device $MP_{1x}$; the variable $r_{DS}(MP_{1x})$ represents the value of the drain to source resistance of device $MP_{1x}$; and the variable $r_{DS}(MN_{1x})$ represents the drain to source resistance of device $MN_{1x}$. In a FET device such as $MP_{1x}$, transconductance is the ratio of the change in output current to the initiating change in input voltage.

Figure 3:
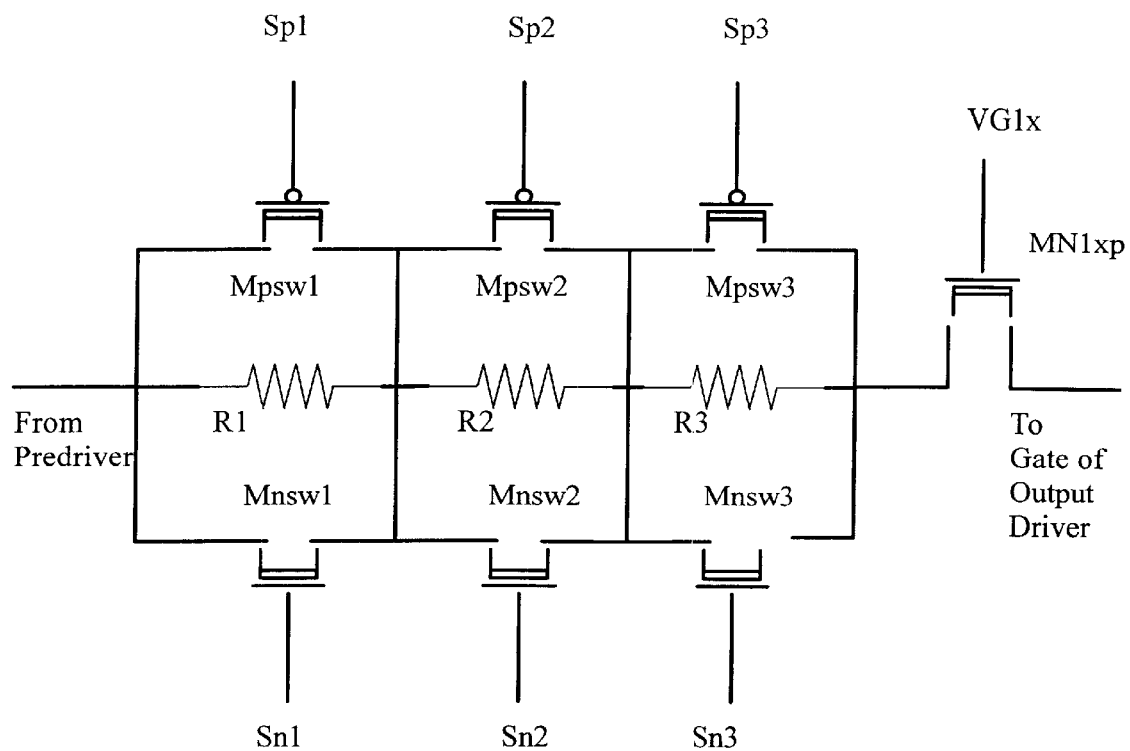
FIG. 3 is a schematic diagram illustrating a resistor chain useable in the first embodiment.

FIG. 3 shows the circuit for the realization of time constant $\tau = RC$. Discrete resistors $R_1$, $R_2$, $R_3$, etc. in series with $R_{on}$ ($MN_{1xp}$) form a programmable resistor chain. The number of discrete resistors may be chosen as needed for fine resolution for slew rate control. The value of discrete resistors is in a range of k$\Omega$. Each of the resistors such as $R_1$ can be bypassed by a pair of devices $M_{nsw1}/M_{psw1}$ which are controlled by signals $S_{n1}/S_{p1}$ respectively. The PVT controller can be utilized to set the desired value of resistance. For example, for the worst case conditions (lowest output drive current), the PVT controller will select the lowest resistance combination of R to yield the smallest time constant $\tau$. This will augment the overall buffer delay for less variation and maintain the buffer slew rate across the PVT worst case values.

The output device $MP_{ix}$ and $NM_{ix}$ are of different sizes. The W/L of the P-channel device is larger than the W/L of the N-channel device by a factor of $\mu_n/\mu_p=2.5$ (ratio of electron and hole mobilities). The resulting P-channel gate-to-drain capacitance is larger that of the N-channel device. Therefore, $R_{ON1}$ and $R_{ON2}$ will be adjusted for this difference to make the rise and fall time (+/− slew rate) symmetric. In the prior art, slew rate symmetry was nearly impossible to achieve.

The preferred embodiment uses CMOS technology. Alternatively, the driver transistors could be implemented with bi-polar technology. The device sizes of the pre-drivers and output transistors can be varied, thus providing finer control over slew rate and drive strength during varying PVT conditions.

An intended advantage of an embodiment of the invention is to provide high speed bus communication between two devices.

Another intended advantage of an embodiment of the invention is to reduce error rates in high speed communication busses. In particular, the slew rate controlled driver circuitry reduces ringing on power lines and ensure a consistent rise and fall time for data signals, thus reducing data distortion which in turn reduces error rates by matching transmission line impedances.

Another intended advantage of an embodiment of the invention is to provide an interface circuitry for multiple devices coupled to a bus.

Another intended advantage of the invention is to provide a uniform and quick response from a bank of driver circuits.

In operation, as shown in FIG. 2, an input signal IN passes through the two inverters $I_1$ and $I_2$ causing a delay of up to a few nanoseconds for gate propagation. The inverters $I_1$ and $I_2$ buffer the large input capacitance of output devices driven from the core of the chip. If all control signals CTRL are enabled, the input signal from the inverters passes through resistances $R_{ON1}$ and $R_{ON2}$ before passing on the CMOS inverter formed from devices $MP_{1x}$ and $MN_{1x}$ to generate output signal OUT.

The two devices $MP_{1x}$ and $MN_{1x}$ are designed to have matching characteristics. Thus, they are complementary to each other. When off, their resistance is effectively infinite; when on, their channel resistance is about 200$\Omega$. Since the CMOS gate is essentially an open circuit, it draws no current and the output voltage is equal to either $V_{SS}$ or $V_{DD}$, depending on which device is conducting. The parallel resistance of the on-resistance of the P-channel driver with $R_{p1}$ is desirably equal to 75$\Omega$ so as to be equal to the driven transmission line characteristic impedance $Z_o$.

When the delayed input signal from the inverters $I_1$ and $I_2$ at the gates of the devices $MP_{1x}$ and $MN_{1x}$ is grounded (logic 0), the N-channel device $MN_{1x}$ is unbiased, and therefore has no channel enhanced within itself. It is an open circuit, and therefore leaves the output line disconnected from ground. At the same time, the P-channel device $MP_{1x}$ is on, so it has a channel enhanced within itself. This channel has a resistance of about 200$\Omega$, connecting the output line to $V_{DD}$. This pulls the output signal OUT up to a logic 1 level. The parallel resistance of the on-resistance of the N-channel driver with $R_{N1}$ is desirably equal to 75$\Omega$ so as to be equal to the driven transmission line characteristic impedance $Z_o$.

When the delayed input at the gates of the devices $MP_{1x}$ and $MN_{1x}$ is at a logic 1 level, the P-channel device $MP_{1x}$ is off and the N-channel device $MN_1$ is on, thus pulling the output signal OUT down to ground (logic 0). Thus, this circuit performs logic inversion, and simultaneously active pull-up and pull-down, according to the output state.

As an alternative embodiment, the incorporation of FIG. 3's resistor chain in place of resistor $R_{ON1}$ allows for fine control of the slew rate.

Resistors $R_{ON1}$ and $R_{ON2}$ serve to augment the total output resistance to characteristic impedance $Z_o$.

$V_{SS}$ is ground or a negative supply voltage. $V_{DD}$ is a positive supply voltage.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A circuit comprising:
   a combination of an output side PMOS transistor having a gate and a drain and an output side NMOS transistor having a gate and a drain, the output side PMOS transistor and the output side NMOS transistor being coupled together through their respective drains capable of outputting an output signal on a bus line;

a first capacitance connected in parallel to the gate-drain junction of the output side PMOS capacitor;

a variable impedance circuit having an output coupled to one of the gates of the combination of the output side PMOS transistor and the output side NMOS transistor, the variable impedance circuit being configured to adjust the slew rate of the output signal in response to changes in fabrication process and operating conditions wherein the variable impedance circuit comprises:

a first resistor, a first NMOS transistor having a gate, and a first PMOS transistor having a gate in parallel and coupled to the first capacitance, wherein the gate of the first NMOS transistor and the gate of the first PMOS transistor are coupled to a process, voltage, and temperature controller, wherein the variable impedance circuit is not directly connected to the bus line.

2. The circuit of claim 1, wherein the circuit is a bus driver circuit.

3. The circuit of claim 2, wherein the bus driver circuit is a PCI bus driver circuit.

4. The circuit of claim 2, wherein the bus driver circuit is a SCSI bus driver circuit.

5. The circuit of claim 2, wherein the bus driver circuit is a controlled impedance bus driver circuit.

6. The circuit of claim 1, wherein the circuit is a buffer circuit.

7. The circuit of claim 1, the variable impedance circuit further comprising a second resistor, a second NMOS transistor, and a second PMOS transistor in parallel, wherein the gate of the second NMOS transistor and the gate of the second PMOS transistor are coupled to the process, voltage, and temperature controller.

8. A variable impedance circuit for use in a bus driver circuit, comprising:

a first combination of a first impedance, a first NMOS transistor, and a first PMOS transistor in parallel;

a second combination of a second impedance, a second NMOS transistor, and a second PMOS transistor in parallel;

wherein the first combination of the first impedance, the first NMOS transistor, and the first PMOS transistor has a first end and an opposing second end and the second combination of the second impedance, the second NMOS transistor, and the second PMOS transistor has a third end and an opposing fourth end, wherein the second end of the first combination and the third end of the second combination are directly electrically connected, wherein the first end of the first combination receives an input signal.

9. The variable impedance circuit of claim 8, further comprising a third combination of a third impedance, a third NMOS transistor, and a third PMOS transistor in parallel and having a fifth end and a sixth end, wherein the fifth end of the third combination is directly electrically connected to the fourth end of the second combination.

10. The variable impedance circuit of claim 9, wherein the gates of the first NMOS transistor, the first PMOS transistor, the second NMOS transistor, the second PMOS transistor, the third NMOS transistor, and the third PMOS transistor receive input signals from a process, voltage, temperature controller.

11. The variable impedance circuit of claim 10, wherein there are n-3 additional combinations, each of the combinations consisting of a single NMOS transistor, a single PMOS transistor, and a resistor in parallel, wherein for 3<k<n, one end of the kth combination is directly electrically connected to the (k-1) th combination and the other end of the kth combination is directly electrically connected to the (k+1) th combination.

12. The variable impedance circuit of claim 11, wherein one end of the n th combination is directly electrically connected to the (n-1) th combination and the other end of the n th combination is electrically connectable to a gate of one of an output side PMOS transistor and an output side NMOS transistor which drive an output signal on a bus.

13. The variable impedance circuit of claim 12, wherein the gates of the fourth to nth NMOS and PMOS transistors receive input signals from the process, voltage, temperature controller.

14. The variable impedance circuit of claim 9, wherein the sixth end is electrically connectable to a gate of one of an output side PMOS transistor and an output side NMOS transistor which drive an output signal on a bus.

15. The variable impedance circuit of claim 8, wherein the fourth end is electrically connectable to a gate of one of an output side PMOS transistor and an output side NMOS transistor which drive an output signal on a bus.

16. A method of outputting a signal from a bus driver circuit, comprising:

inputting an initial input signal;

delaying the initial input signal;

branching off the initial input signal into a first input signal and a second input signal;

providing process, voltage, temperature controller signals to a variable impedance circuit through which at least one of the first and second input signals passes;

supplying first and second control signals through two separate and distinct sets of control logic that control the passage of the first input signal to the gate of an output PMOS transistor and the passage of the second input signal to the gate of an output NMOS transistor, the drains of the output PMOS transistor and the output NMOS transistor being electrically connected; and providing an output signal from the connected drains of the output PMOS transistor and the output NMOS transistor.

17. The method according to claim 16, wherein there is a capacitance parallel to the gate and drain junction of the output PMOS transistor.

18. The method according to claim 17, further comprising regulating the slew rate of the bus driver circuit through the variable impedance circuit so as to make the slew rate symmetric.

19. A method for providing a variable impedance, comprising:

providing a daisy chain of parallel combinations, each combination consisting of a PMOS transistor, a resistor, and an NMOS transistor in parallel, the transistors connected to one end of the resistor by their sources and the other end of the resistor by their drains;

inputting an input signal at one end of the daisy chain; and receiving an output from the other end of the daisy chain.

20. The method of claim 19, further comprising applying gate control signals to the gates of each and every of the PMOS and NMOS transistors of the daisy chain.

21. The method of claim 20, wherein the gate control signals to the daisy chain originate from a process, voltage, temperature controller.

22. A method for providing an output signal for a bus driver circuit, comprising:

supplying data control signals and a data signal along separate paths;

branching the data signal into a first data signal and a second data signal; and passing the first data signal through a variable impedance according to the method of claim 19.

23. A bus driver circuit, comprising:

a first PMOS transistor and a first NMOS transistor, each having a gate and a drain, being an electrical connection being formed through their drains, an output signal being provided from the electrical of their drains;

a first set of logic gates for providing a first control signal;

a first impedance;

a second impedance;

a second set of logic gates for passing a first input signal, the first input signal being branched into a second input signal which passes through the first impedance and being branched into a third input signal which passes through the second impedance;

a third set of logic gates for providing a second control signal;

a second PMOS transistor having a gate and a drain and a second NMOS transistor having a gate and a drain, the second PMOS transistor and the second NMOS transistor being electrically connected together through their drains, the first control signal being provided to the gates of the second PMOS transistor and the second NMOS transistor, the second NMOS transistor being switched on by the first control signal so as to pass the second input signal to the gate of the first PMOS transistor;

a third PMOS transistor having a gate and a drain and a third NMOS transistor having a gate and a drain, the third PMOS transistor and the third NMOS transistor being electrically connected together through their drains, the second control signal being provided to the gates of the third PMOS transistor and the third NMOS transistor, the third PMOS transistor being switched on by the second control signal so as to pass the third input signal to the gate of the first NMOS transistor.

the first and second impedances establishing a slew rate of the output signal.

24. The bus driver circuit of claim 23, wherein the first control signal determines passage of the second input signal to the gate of the first PMOS transistor, the second control signal determines passage of the third input signal to the gate of the first NMOS transistor.

25. The bus driver of claim 24, wherein a first capacitance is formed in parallel to the gate and drain of the first PMOS transistor.

26. The bus driver of claim 25, wherein the first impedance is a variable impedance.

27. The bus driver of claim 25, wherein the first impedance is the variable impedance circuit of claim 8.

28. The bus driver of claim 25, wherein the first impedance is the variable impedance circuit of claim 10.

29. The bus driver of claim 25, wherein the first impedance is the variable impedance circuit of claim 11.

30. The bus driver of claim 29, wherein the product of the value of the first capacitance and the first impedance establishes an RC time constant which maintains the slew rate of the output signal output by the first PMOS transistor and the first NMOS transistor.

31. The bus driver of claim 30, wherein the variable impedance circuit receives inputs from a process voltage temperature controller.

32. The bus driver of claim 31, wherein the on-resistance of the second NMOS transistor is additionally used to determine the RC time constant.

33. The bus driver of claim 32, wherein a resistance between the first NMOS transistor and the first PMOS transistor, the drain-source resistance of the first NMOS transistor and the drain-source resistance of the first PMOS transistor are additionally used to determine the RC time constant.

34. The bus driver circuit of claim 23, wherein the output current strength of the output signal is independently controllable by paralleling a first output device which includes the first PMOS transistor, the first impedance, and the first set of logic gates and a second output device which includes the first NMOS transistor, the second impedance, and the third set of logic gates.

35. The bus driver circuit of claim 23, wherein the first impedance and the second impedances are both discrete resistors.

36. The bus driver circuit of claim 23, wherein no more than one of the first and second impedances are discrete resistors.

37. A bus driver circuit, comprising:

a first impedance for passing through from a first end to a second end and branching off an initial input signal into a first input signal;

a second impedance for passing through from a first end to a second end and branching off the initial input signal into a second input signal;

an output side PMOS transistor having a gate and a drain and an output side NMOS transistor having a gate and a drain, the output side PMOS transistor and the output side NMOS transistor having an electrical connection through their drains, a bus driving output signal being provided by the electrical connection of the drains;

a first switching transistor for switchably passing through the first input signal to the gate of the output side PMOS transistor;

a second switching transistor for switchably passing through the second input signal to the gate of the output side NMOS transistor, wherein one of the first and second impedances is a variable impedance formed from at least one transistor electrically connected in parallel with a resistor.

38. The bus driver circuit of claim 37, wherein, when the first switching transistor is switched on, a continuous and unbroken electrically conductive path is established from the first end of the first impedance to the gate of the output side PMOS transistor.

39. The bus driver circuit of claim 38, wherein a first set of control logic gates provide a first control signal to the first switching transistor and a second set of control logic gates provide a second control signal to the second switching transistor, wherein the at least one transistor of the variable impedance is a parallel pair of an NMOS transistor and a PMOS transistor, electrically connected at their respective drains and sources, which receive signals at their gates from a process, voltage, temperature controller, wherein the first and second switching transistors are MOS transistors.

40. The bus driver circuit of claim 37, wherein, when the second switching transistor is switched on, a continuous and unbroken electrically conductive path is established from the first end of the second impedance to the gate of the output side PMOS transistor.

41. A method of adjusting slew rate of a bus driving output signal which is output through an electrical connection between the first and second output devices, comprising:

branching a first input signal into a second input signal through a first resistor and into a third input signal through a second resistor;

controllably switching the second input signal to an output transistor of the first output device such that a conductive path is established between the first input signal end of the first resistor and the output transistor of the first output device; and controllably switching the third input signal to an output transistor of the second output device such that a conductive path is established between the first input signal end of the second resistor and the output transistor of the second output device.

42. The method of claim 41, wherein a first set of control logic provides a signal to controllably switch the second input signal to the output transistor of the first output device, and a second set of control logic provides a signal to controllably switch the third input signal to the output transistor of the second output device.

43. The method of claim 42, wherein the first set of control logic and the second set of control logic are designed to minimize the logic stages so as to result in a shorter signal delay and faster response time in driving the output signal.

44. The method of claim 41, wherein the output transistor of the first output device is a PMOS transistor and the output transistor of the second output device is an NMOS transistor, the PMOS transistor and the NMOS transistor being electrically connected at their drains to provide the bus driving output signal.

45. The method of claim 41, wherein the first and second resistors are independently controlled to adjust the signal slew rate.

* * * * *